(12) United States Patent
Song

(10) Patent No.: US 9,478,961 B2
(45) Date of Patent: Oct. 25, 2016

(54) IRON BUS BAR HAVING COPPER LAYER, AND METHOD FOR MANUFACTURING SAME

(71) Applicant: KOREA INSTITUTE OF INDUSTRIAL TECHNOLOGY, Chungcheongnam-do (KR)

(72) Inventor: Young Sik Song, Incheon (KR)

(73) Assignee: KOREA INSTITUTE OF INDUSTRIAL TECHNOLOGY, Chungcheongnam-Do (KR)

( * ) Notice: Subject to any disclaimer, the term of this patent is extended or adjusted under 35 U.S.C. 154(b) by 0 days.

(21) Appl. No.: 14/371,577

(22) PCT Filed: May 28, 2013

(86) PCT No.: PCT/KR2013/004668
§ 371 (c)(1),
(2) Date: Jul. 10, 2014

(87) PCT Pub. No.: WO2013/180443
PCT Pub. Date: May 12, 2013

(65) Prior Publication Data
US 2014/0352999 A1 Dec. 4, 2014

(30) Foreign Application Priority Data
May 29, 2012 (KR) ........................ 10-2012-0056935

(51) Int. Cl.
*B32B 15/00* (2006.01)
*H02G 5/00* (2006.01)
*C23C 14/16* (2006.01)
*H01B 1/02* (2006.01)

(52) U.S. Cl.
CPC .............. *H02G 5/00* (2013.01); *C23C 14/165* (2013.01); *H01B 1/02* (2013.01)

(58) Field of Classification Search
CPC ..................................................... B32B 15/015
USPC .................................................. 428/676, 677
See application file for complete search history.

(56) References Cited

U.S. PATENT DOCUMENTS

| | | | |
|---|---|---|---|
| 2,317,350 A * | 4/1943 | Adler ................... | C25D 7/0614 128/204.22 |
| 2,428,318 A * | 9/1947 | Nachtman ................ | C25D 5/10 205/138 |
| 3,847,560 A * | 11/1974 | Turk ...................... | B23K 20/22 428/635 |

(Continued)

FOREIGN PATENT DOCUMENTS

| JP | 2003-203534 A | 7/2003 | |
|---|---|---|---|
| JP | 2003203534 | * 7/2003 | ............... H01H 1/02 |

(Continued)

OTHER PUBLICATIONS

International Search Report for PCT/KR2013/004668.

*Primary Examiner* — Humera Sheikh
*Assistant Examiner* — Seth Dumbris
(74) *Attorney, Agent, or Firm* — The PL Law Group, PLLC

(57) ABSTRACT

The present invention related to an iron bus bar coated with copper and a method of manufacturing the same. The present invention provides an iron bus bar including an iron core and a copper layer applied on the iron core, and a method of manufacturing the same. According to the present invention, an iron bus bar having high strength and durability as well as excellent electrical conductivity can be manufactured at low cost.

4 Claims, 8 Drawing Sheets

(56) References Cited

U.S. PATENT DOCUMENTS

| | | | | |
|---|---|---|---|---|
| 5,156,923 | A * | 10/1992 | Jha | B23K 20/02 228/190 |
| 6,194,088 | B1 * | 2/2001 | Yoshida | C23C 26/00 148/530 |
| 6,830,847 | B2 * | 12/2004 | Ramaswami | H01M 2/0222 429/171 |
| 2002/0071962 | A1 * | 6/2002 | Schreiber | B32B 15/04 428/635 |
| 2002/0187391 | A1 * | 12/2002 | Buckle | B32B 15/015 429/176 |
| 2011/0253547 | A1 * | 10/2011 | Stimits | H01M 2/0222 205/151 |
| 2012/0208703 | A1 * | 8/2012 | Okayama | B32B 15/01 505/239 |

FOREIGN PATENT DOCUMENTS

| | | |
|---|---|---|
| JP | 2006-299363 A | 11/2006 |
| KR | 10-2006-0041678 A | 5/2006 |
| KR | 10-2010-0080811 A | 7/2010 |
| KR | 10-2010-0124086 A | 11/2010 |

* cited by examiner

US 9,478,961 B2

IRON BUS BAR HAVING COPPER LAYER, AND METHOD FOR MANUFACTURING SAME

CROSS REFERENCE TO RELATED APPLICATIONS AND CLAIM OF PRIORITY

This patent application is a National Phase application under 35 U.S.C. §371 of International Application No. PCT/KR2013/004668, filed 28 May 2013, which claims priority to Korean Patent Application No. 10-2012-0056935, filed 29 May 2012, entire contents of which are incorporated herein by reference.

TECHNICAL FIELD

The present invention relates to a bus bar and a method of manufacturing the same, and, more particularly, to an iron bus bar coated with a copper layer having a thickness of several tens of micrometers and a method of manufacturing the same.

BACKGROUND ART

In the past, a cable had been frequently used as a medium for transmitting electrical energy, but, recently, a bus bar, having an advantage of transmitting a larger amount of electrical energy by the same volume of conductor, has been widely used as an alternative to a cable. Such a bus bar must have excellent electrical conductivity, high strength and excellent durability.

A bus bar is used in large industrial distribution boards or switchboards requiring the installation of a large-capacity electrical energy transmitting system as well as in small household distribution boards or switchboards. Such a bus bar is generally composed of a copper bar, and thus its thickness is changed depending on current capacity.

Since copper, which is a main raw material of a bus bar, mostly depends on import, it is sensitive to foreign copper prices. The price of copper is greatly changed every year, and the change in import price of copper is also increased, thus increasing the cost of manufacturing a bus bar.

Recently, in order to solve such a problem by reducing cost, decreasing weight and improving performance, a composite bus bar, which is formed by coating aluminum with copper or by coating an iron alloy with copper, has entered the market.

Such a composite bus bar is currently manufactured by clad bonding, hydrostatic extrusion or indirect extrusion. In clad bonding, a composite bus bar is manufactured by rolling two or more metal materials at high temperature to bond them together. In both hydrostatic extrusion and indirect extrusion, a layered composite bus bar is manufactured by inserting a billet having a predetermined shape into an extrusion container.

However, the clad bonding method is problematic in that the rolling of metal materials is generally performed at high temperatures, but metal materials, such as copper, iron and the like, are oxidized at a low temperature of 200° C. or lower, and the thermal expansion rates thereof are different from each other, so these metal materials are not suitably bonded, thereby producing defective products in large quantity. Further, this clad bonding method is problematic in that manufacturing processes and equipment are complicated, thus increasing a production cost.

Meanwhile, the hydrostatic extrusion and indirect extrusion methods are also problematic in that the treatment of a pressure transmission solvent is not easy, an extruder is large-sized and high-priced, the maintenance cost of the extruder is high, and the operation method thereof is complicated, so the efficiency of a work is reduced, thereby causing the unit cost of a bus bar to increase.

SUMMARY

The present inventors made efforts to solve the above-mentioned problems. As a result, they developed a technology of coating an iron core with a copper layer to a thickness of several tens of micrometers, thus completing the present invention.

Therefore, an object of the present invention is to provide an iron bus bar, which is configured such that an iron core, containing cheap iron having high strength despite having lower electrical conductivity than copper, is uniformly coated with a copper layer to a thickness of several tens of micrometers, thus exhibiting excellent electrical conductivity, durability and strength; and to provide a method of manufacturing the same.

Another object of the present invention is to provide an iron bus bar, wherein an iron core is pretreated before the formation of a copper layer, and/or a buffer layer is formed between the iron core and a copper layer, thus improving the adhesion between the iron core and the copper layer formed on the surface of the iron core; and to provide a method of manufacturing the same.

Still another object of the present invention is to provide an iron bus bar, wherein the grain size of a copper layer formed on the surface of a iron core can be controlled, so the specific surface area and electrical conductivity thereof can be improved, thereby improving the characteristics of a bus bar and controlling the shape and size thereof; and to provide a method of manufacturing the same.

Still another object of the present invention is to provide an iron bus bar, wherein the corrosion of a copper layer can be prevented, and/or additional resistance reduction and high quality texture can be realized by further post treatment on the surface of the copper layer; and to provide a method manufacturing the same.

Still another object of the present invention is to provide an iron bus bar which is configured to be optimized in the form of both small and medium-sized bus bars; and to provide a method manufacturing the same.

The objects of the present invention are not limited to the above-mentioned objects, and other unmentioned objects thereof will be clearly understood by those skilled in the art from the following descriptions.

In order to accomplish the above objects, an aspect of the present invention provides am iron bus bar, including: an iron core composed of an iron-containing material; and a copper layer formed on the surface of the iron core to a thickness of 10 to 30 μm.

Here, the iron-containing material may be any one selected from the group consisting of pure iron, carbon steel, stainless steel, a Fe—Al alloy and a Fe—Cu alloy.

The iron bus bar may further include a buffer layer formed between the iron core and the copper layer.

The buffer layer may include: a first buffer layer formed on the iron core to have a thickness of 1 μm or less from the surface of the iron core and including iron in an amount of 92.4 to 100 wt % at the interface thereof making contact with the iron core; and a second buffer layer formed between the first buffer layer and the copper layer to have a thickness of 1 μm or less and including copper in an amount of 95.9 to 100 wt % at the interface thereof making contact with the copper layer.

The buffer layer may be configured such that the first buffer layers and the second layers are alternately and repeatedly formed two or more times.

The iron bus bar may further include a corrosion-resistant layer formed on the surface of the copper layer to a thickness of 1 μm or less.

The corrosion-resistant layer may include at least one selected from the group consisting of Sn, Cr, Zr, Ag and Cu.

The corrosion-resistant layer may include 0 to 15.9 wt % of any one selected from the group consisting of Sn, Cr, Zr and Ag and 84.2 to 100 wt % of Cu at the interface thereof making contact with the copper layer.

The iron bus bar may further include an uppermost layer having a thickness of 1 μm or less and including at least one of Ag and Ti, which is formed on the surface of the corrosion-resistant layer.

Another aspect of the present invention provides a method of manufacturing an iron bus bar, including the steps of: preparing an iron core; and forming a copper layer having a thickness of 10 to 30 μm on the iron core by coating.

In the method, the step of forming the copper layer may be performed by sputtering.

In the method, heat treatment may be further performed at 200 to 300° C. during the sputtering or after the sputtering.

The method may further include the step of cleaning the iron core with plasma before the step of forming the copper layer.

The method may further include the step of forming a buffer layer on the iron core by coating before the step of forming the copper layer.

In the method, the step of forming the buffer layer may be performed by the sequential or simultaneous sputtering of buffer materials using two targets. In this step, a voltage may be applied to an iron target and then applied to a copper target at a predetermined time difference in order to: form a first buffer layer on the iron core to have a thickness of 1 μm or less from the surface of the iron core and to include iron in an amount of 92.4 to 100 wt % at the interface thereof making contact with the iron core; and form a second buffer layer between the first buffer layer and the copper layer to have a thickness of 1 μm or less from the surface of the first buffer layer and to include copper in an amount of 95.9 to 100 wt % at an interface thereof making contact with the copper layer.

The method may further include the step of forming a corrosion-resistant layer on the surface of the copper layer to a thickness of 1 μm or less by coating.

The method may further include the step of forming an uppermost layer having a thickness of 1 μm or less and including at least one of Ag and Ti on the corrosion-resistant layer by coating.

The present invention has the following advantages.

First, according to the present invention, an iron core, containing cheap iron having high strength despite having lower electrical conductivity than copper, is uniformly coated with a copper layer to a thickness of several tens of micrometers, and thus an iron bus bar having excellent electrical conductivity, durability and strength can be manufactured in large amounts at low cost.

Further, according to the present invention, an iron core is pretreated before the formation of a copper layer, and/or a buffer layer is formed between the iron core and a copper layer, thus improving the adhesion between the iron core and the copper layer formed on the surface of the iron core.

Further, according to the present invention, the grain size of a copper layer formed on the surface of an iron core can be controlled, so the specific surface area and electrical conductivity thereof can be improved, thereby improving the characteristics of a bus bar and controlling the shape and size thereof Further, according to the present invention, the corrosion of a copper layer can be prevented, and/or additional resistance reduction and high quality texture can be realized by further post treatment on the surface of the copper layer.

Further, according to the present invention, the iron bus bar, which is configured to be optimized in the form of both small and medium-sized bus bars.

DETAILED DESCRIPTION

Figure 1A:
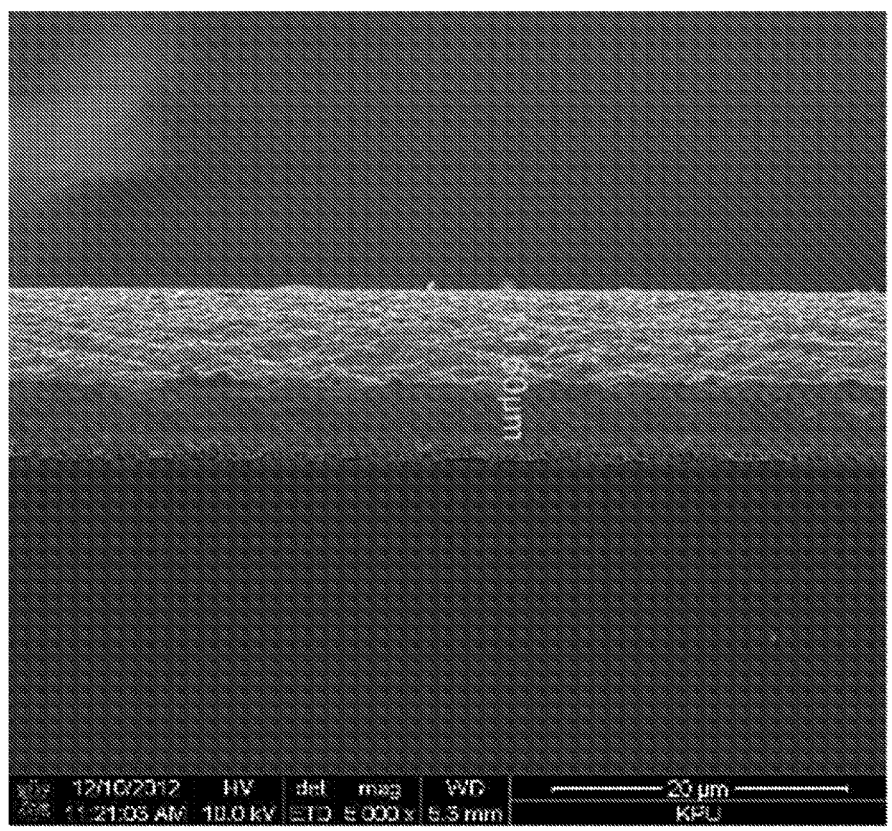
FIGS. 1A to 1E are scanning electron microscope (SEM) photographs showing the sectional images of iron bus bars obtained from Examples and Comparative Examples.

It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Hereinafter, preferred embodiments of the present invention will be described in detail with reference to the attached drawings.

Throughout the accompanying drawings, the same reference numerals are used to designate the same or similar components, and redundant descriptions thereof are omitted.

The first technical characteristic of the present invention is to provide an iron bus bar including a iron core composed of an iron-containing material and a copper layer formed on the iron core and having a thickness of several tens of micrometers, which is inexpensive and has electrical conductivity equal to or higher than that of a conventional copper bus bar used in distribution boards or switch boards made of only copper. That is, the reason for this is that a conventional copper bus bar is problematic in that it is very expensive because it is entirely made of expensive copper, and in that its strength is low.

Therefore, the present invention provides an iron bus bar, including: an iron core composed of an iron-containing material; and a copper layer formed on the surface of the iron core to a thickness of 10 to 30 μm.

The structure of the iron bus bar of the present invention is attributed to a skin depth effect of most of electric current flowing through the surface of a bus bar. That is, the iron core constituting the iron bus bar of the present invention contributes to the improvement of the strength thereof, and the copper layer formed on the surface of the iron core to a thickness of several tens of micrometers to constitute the outer layer of the iron bus bar can be used as a channel of electric current, thus allowing the iron bus bar of the present invention to have high strength and durability as well as excellent electrical conductivity. Like this, the iron bus bar of the present invention is advantageous in that it can exhibit excellent electrical conductivity because of the copper layer formed on the surface of the iron core, and in that it is stable to thermal load because the iron core has high strength and low density.

Firstly, the iron-containing material constituting the iron core of the iron bus bar of the present invention is very advantageous in terms of cost reduction compared to copper or aluminum that has been conventionally used. Meanwhile, based on the International Annealed Copper Standard (IACS, %), the electrical conductivity of copper is 103.06, that of aluminum is 64.95, and that of iron is 17.5. That is, the electrical conductance of copper is $5.8 \times 10^7$ mhos/m, that of aluminum is $3.82 \times 10^7$ mhos/m, that of iron is $1.03 \times 10^7$ mhos/m, and that of stainless steel is $1.1 \times 10^6$ mhos/m. Therefore, iron is disadvantageous in that its electrical conductivity is lower than that of copper. In contrast, platinum used in coating an electrode of an electronic component or used as an electrode material has an electrical conductance of $9.52 \times 10^6$ mhos/m, and solder used as a wiring material or bonding material in the process of packaging an electronic component has an electrical conductance of $7 \times 10^6$ mhos/m. Considering these data, the electrical conductance of iron is not at all inferior to that of other metal materials.

The physical properties of copper, aluminum and iron are given in Table 1 below.

TABLE 1

| Class. | Copper | Aluminum | Iron |
| --- | --- | --- | --- |
| Density (g/cm$^3$) | 8.96 | 2.69 | 7.87 |
| Melting point (° C.) | 1083.4 | 660.37 | 1535 |
| Thermal expansion coefficient ($10^{-6}$/° C.) | 16.5 | 23.6 | 11.7 |
| Thermal conductivity (W/cmK) at 273 K | 4.01 | 2.36 | 0.835 |
| Electrical conductivity (% IACS) | 103.06 | 64.95 | 17.75 |
| Electrical conductance (mhos/m) | $5.80 \times 10^7$ | $3.82 \times 10^7$ | $1.03 \times 10^7$ |
| Specific resistance (μΩ · cm) | 1.67 | 2.65 | 9.71 |
| Yield strength (MPa) | 69-365 | 215-415 | 276-621 |
| Tensile strength (MPa) | 221-455 | 141-460 | 414-689 |

As given in Table 1 above, iron has excellent electrical conductivity and has high strength compared to copper, aluminum and other metal materials. That is, when the iron-containing material is used in manufacturing a bus bar, the bus bar is imparted with high strength to exhibit excellent durability, and can thus be safely protected from external shocks. Further, since the density of iron is about 88% that of copper, the weight of a distribution board or switchboard that uses a large number of bus bars can be reduced by 10% compared to a conventional distribution board or switchboard, thus improving the workability and transportability of the distribution board or switchboard. Further, since the melting point of iron is about 1.4 times higher than that of copper, and about 2.3 times higher than that of aluminum, its thermal stability is also excellent.

When an air cooling load rapidly increases in summer, a large amount of electric current flows through a bus bar of a distribution board or switchboard, and thus the temperature of the bus bar instantaneously increases. In this case, the iron bus bar of the present invention is advantageous in that it exhibits excellent durability and stability under an environment influenced by stress together with thermal load because it has relatively high durability and stability at high temperature, and particularly, it has high yield strength and tensile strength. Further, since the thermal expansion coefficient of iron is about 70% that of copper, and is about 50% that of aluminum, the iron bus bar is advantageous in that its deformation ration is relatively low when thermal load is generated due to the air cooling in hot summer.

As described above, it can be ascertained that the iron-containing material constituting the iron core of the present invention is lighter than copper in weight, is 1.5 times higher than copper and aluminum in strength, is superior to copper and aluminum in thermal stability and durability, and is about 1/10 the price of copper.

Meanwhile, the iron-containing material constituting the iron core of the present invention is not particularly limited, as long as it contains iron and has electrical conductivity. Preferably, the iron-containing material may include any one selected from the group consisting of pure iron, carbon steel, stainless steel, a Fe—Al alloy and a Fe—Cu alloy. In order to secure excellent electrical conductivity, the iron-containing material may include pure iron.

Next, the iron bus bar of the present invention includes a copper layer formed on the surface of the iron core. It is preferred that the thickness of the copper layer be 10 to 30 μm, which is optimal thickness in the usable temperature range. When the thickness of the copper layer is less than 10 μm, the copper layer cannot secure the thickness sufficient to obtain a skin depth effect, and thus the electrical conductivity of the copper layer may become lower than that of a conventional copper bus bar. Generally, the electrical conductivity of the copper layer is improved as the thickness thereof increases. However, when the thickness of the copper layer is more than 30 μm, the cost reduction effect thereof decreases, and the productivity thereof is reduced. That is, the electrical conductivity of the copper layer is improved with the increase in the thickness thereof, but processing time is excessively spent, the consumption of a raw material increases, and the unit cost of processing increases, thus increasing the unit cost of production.

The second technical characteristic of the present invention is that the iron bus bar of the present invention further includes: a buffer layer for improving the adhesion between the iron core and the copper layer; and a protection layer for protecting the copper layer. That is, comparing the iron bus bar of the present invention with a conventional copper bus bar, in the case of the iron bus bar including the iron core and the copper layer formed on the surface of the iron core, the adhesion between the iron core and the copper layer may become low, and the electrical conductivity of the iron bus bar may be deteriorated when the copper layer having optimal thickness is damaged. However, when the buffer layer is formed between the iron core and the copper layer, the adhesion between the iron core and the copper layer can be improved, stress can be controlled at a low level, and thermal load can be reduced.

Therefore, the iron bus bar of the present invention may further include a buffer layer between the iron core and the copper layer in order to improve the physical properties thereof, such as the adhesion between the iron core and the copper layer, and the like. The buffer layer may have thickness to such a degree that the copper layer is not separated from the iron core. Preferably, the buffer layer may have a thickness of 0.2 μm to 5 μm.

In this case, the buffer layer may be made of any one selected from the group consisting of Fe, Cu, Ni, Cr, Ti, Ta, Zr, Al, Mo, Ag and Au, but, in order to more improve the adhesion between the iron core and the copper layer, the buffer layer may be made of two or more selected therefrom. That is, the buffer layer may be configured such that the interface thereof making contact with the iron core contains a large amount of iron, and the interface thereof making contact with the copper layer contains a large amount of copper.

Particularly, the buffer layer may further include: a first buffer layer formed on the iron core to have a thickness of 1 μm or less from the surface of the iron core and including iron in an amount of 92.4 to 100 wt % at the interface thereof making contact with the iron core; and a second buffer layer formed between the first buffer layer and the copper layer to have a thickness of 1 μm or less and including copper in an amount of 95.9 to 100 wt % at an interface thereof making contact with the copper layer. If necessary, the buffer layer may be configured such that the first buffer layers and the second layers are alternately and repeatedly formed two or more times. Through the above configuration, the surface of the buffer layer can be made smooth, stress can be reduced, and the interlayer adhesion can be improved. In this case, thin films made of two or more kinds of materials and having predetermined thickness may be alternately deposited in the form of several layers up to hundreds of layers.

Meanwhile, in order to protect the copper layer, that is, in order to improve the corrosion resistance of the iron bus bar, the iron bus bar may further include a corrosion-resistant layer formed on the surface of the copper layer to a thickness of 1 μm or less. The corrosion-resistant layer may include at least one selected from the group consisting of Sn, Cr, Zr, Ag and Cu. In order to increase the adhesion between the corrosion-resistant layer and the copper layer, the corrosion-resistant layer may include 0 to 15.9 wt % of any one selected from the group consisting of Sn, Cr, Zr and Ag and 84.2 to 100 wt % of Cu at the interface thereof making contact with the copper layer. In this case, in order to double the effect of improving adhesion, the corrosion-resistant layer may include 100 wt % of Cu at the interface thereof making contact with the copper layer, and the content of Cu may be reduced as the distance from the surface of the corrosion-resistant layer decreases.

Meanwhile, in the case where the entire corrosion-resistant layer is formed of an alloy of copper and other metal, in order for the corrosion-resistant layer to protect the copper layer and to have electrical conductivity of 90% or more of that of the copper layer, the corrosion-resistant layer may include 0 to 15.9 wt % of any one of Sn, Cr, Zr and Ag and 84.2 to 100 wt % of Cu. Among the metal elements constituting an alloy together with Cu, when Sn is included in an amount of 15.9 wt %, Cr is included in an amount of 1 wt %, Zr is included in an amount of 0.172 wt % and Ag is included in an amount of 8 wt % or less, the deterioration of electrical conductivity of the iron bus bar can be reduced, and simultaneously the corrosion resistance thereof can be improved.

If necessary, the iron bus bar may further include an uppermost layer having a thickness of 1 μm or less and including at least one of Ag and Ti, which is formed on the surface of the corrosion-resistant layer. That is, the uppermost layer serves to allow the iron bus bar to realize high-quality texture appearance by using silver color instead of copper color, and serves to improve the characteristics of the iron bus bar because it includes silver, having low electrical resistance and having electrical conductivity equal to that of copper. Particularly, in the case wherein the uppermost layer is made of an alloy of Ag and Ti, the iron bus bar can exhibit improved corrosion resistance as well as realize high-quality texture appearance when the uppermost layer include Ti in an amount of 0 to 2 wt %.

The third technical characteristic of the present invention is to provide a method of manufacturing an iron bus bar, by which a copper layer having a thickness of several tens of micrometers can be formed on the surface of an iron core by using sputtering, and grain size can be controlled, thus manufacturing an iron bus bar having excellent characteristics in large amounts at low cost.

The method of manufacturing an iron bus bar according to the present invention includes the steps of: preparing an iron core; and forming a copper layer having a thickness of 10 to 30 μm on the iron core by coating. If necessary, the method may further include the step of forming one or more of a buffer layer formed between the iron core and the copper layer, a corrosion-resistant layer formed on the surface of the copper layer and an uppermost layer formed on the surface of corrosion-resistant layer.

First, in the step of preparing the iron core, the iron core may be made of an iron-containing material in consideration of the desired size and shape of the iron bus bar.

Next, in the step of forming the copper layer by coating, in order to form a copper layer having a thickness of 10 to 30 μm, the copper layer may be formed by thickness-controllable sputtering. When the copper layer is formed by sputtering, copper is uniformly applied on the iron core, and the size of grains constituting the copper layer can be controlled, thus improving the electrical characteristics thereof.

Meanwhile, due to the characteristics of an iron-containing material, treatment for removing an oxidation layer formed on the surface of the iron core may be performed prior to the preparation of the iron core after the formation of the copper layer. The reason for this is that the oxidation layer is formed on the surface of the iron core due to the characteristics of the iron-containing material, and thus the adhesion between the iron core and the copper layer decreases, thereby causing the copper layer to be separated from the iron core. Consequently, when the copper layer is formed without removing the oxidation layer formed on the surface of the iron core, the iron core and the copper layer may be separated from each other because of the oxidation layer existing on the surface of the iron core. Therefore, in order to solve the problem with the oxidation layer, a mechanical method using polishing or grinding, a chemical method using an etchant or acid solution, a plasma treatment method, or a method of inserting an oxide layer having high adhesion to the oxidation layer and having an effect of reducing stress may be used. Further, it is preferred that the iron core be surface-treated and cleaned. The surface-treatment and cleaning of the iron core may be performed by all methods generally used in the related fields.

In an embodiment of the present invention, particularly, in order to solve the problem with the oxidation layer, the iron core is cleaned with plasma before the formation of the copper layer. That is, when the iron core is cleaned by plasma cleaning, that is, pre-sputtering, there is an effect of etching the pollutants and oxidation layer remaining on the surface of the iron core. The pre-sputtering, that is, plasma cleaning, including pretreatment may be performed for 30 to 60 min under the conditions of a chamber pressure of 1 mTorr, a power of RF 1 kW and an Ar gas flow rate of 100 SCCM, and the pre-sputtering time may be adjusted depending on the amount of the iron core. During the pre-sputtering, ambient temperature may rise to about 80° C. In this case, the temperature in the vicinity of specimen also rises to about 140° C. According to circumstances, grain growth is caused only by such a temperature increase, thus the following additional heat treatment may not be performed.

In the method of manufacturing an iron bus bar according to the present invention, when the step of forming a buffer layer on the iron core by coating is further performed before the step of forming the copper layer, this step is performed by sequential or simultaneous sputtering of buffer materials using two targets. In this step, a voltage is applied to an iron target and then applied to a copper target at a predetermined time difference in order to: form a first buffer layer on the iron core to have a thickness of 1 μm or less from the surface of the iron core and to include iron in an amount of 92.4 to 100 wt % at the interface thereof making contact with the iron core; and form a second buffer layer between the first buffer layer and the copper layer to have a thickness of 1 μm or less from the surface of the first buffer layer and to include copper in an amount of 95.9 to 100 wt % at the interface thereof making contact with the copper layer.

When a corrosion-resistant layer and an uppermost layer are further formed using two targets, similarly to the formation of the buffer layer, the power can be sequentially or simultaneously applied to the targets in consideration of adhesion at the interface contacting the corrosion-resistant layer or the uppermost layer.

If necessary, one alloy target including the same metal as that included in the buffer layer, corrosion-resistant layer and uppermost layer in a predetermined amount may be used instead of the two targets.

In the method of the present invention, the sputtering for forming the copper layer, buffer layer, corrosion-resistant layer and uppermost layer may be performed by coating the entire surface of the iron core without turning the iron core inside out using a rotation jig. This sputtering may be performed for 30 to 300 min at a power of 4 to 5 kW depending on the kind of targets and a base pressure of $5.4 \times 10^{-6}$ Torr or more.

Heat treatment may be simultaneously performed during the sputtering, or may be performed at 200 to 300° C. after the sputtering.

For example, when the sputtering and the heat treatment are performed simultaneously, the iron core may be heated during pre-sputtering, heated in situ during the formation of the copper layer, and heated after the formation of the copper layer. That is, when the iron core is coated by pre-sputtering and sputtering, the iron core is previously put into a vacuum chamber for sputtering, the vacuum chamber is made vacuum, the iron core is heated to about 200° C., and then heat treatment may start. In this case, the degree of vacuum is maintained in high level of $5 \times 10^{-5}$ Torr or more. The process may be continued by applying heat during the sputtering process. After the process, heat is additionally applied to 300° C. below for about 30 min to cause grain growth, thus lowering electrical conductivity. Such heat treatment is effective in lowering the temperature during the usage of a bus bar.

When heat treatment is performed after sputtering, for example, the heat treatment may be performed after the coated iron core is taken out from the vacuum chamber and then put into an atmosphere furnace or vacuum furnace. In this case, the heat treatment may be performed at a temperature of 200 to 300° C. Even in the heat treatment, vacuum must be maintained such that oxidation does not occur. It is preferred that the vacuum be a high vacuum of $5 \times 10^{-5}$ Torr or more. It is considered that heat treatment is performed under an argon atmosphere when it is difficult to apply a vacuum atmosphere, but it is more preferred that heat treatment be performed under a vacuum atmosphere.

Example 1

A copper target having a purity of 4N and a size of 450×120×6.35 mm and an iron core were provided, and then cleaned at a base pressure of $5.4 \times 10^{-6}$ Torr. In this case, the iron core was cleaned by plasma cleaning, and the plasma cleaning of the iron core was performed for 40 min under the conditions of a chamber pressure of 1 mTorr, a power of RF 1 kW and an Ar gas flow rate of 100 SCCM. Thereafter, sputtering was carried out for 3 hr under the conditions of a chamber pressure of 1 mTorr, a power of DC 5 kW and an Ar gas flow rate of 100 SCCM to coat the iron core with copper, thereby obtaining an iron bus bar 1 (COB-13: number 13).

Example 2

An iron bus bar 2 (COB-14: number 14) was obtained in the same manner as in Example 1, except that the sputtering was performed for 5 hr.

Comparative Example 1

A comparative iron bus bar 1 (COB-10: number 10) was obtained in the same manner as in Example 1, except that the sputtering was performed for 1 hr.

Comparative Example 2

A copper target and molybdenum target, each having a purity of 4N and a size of 450×120×6.35 mm, and an iron core were provided, and then cleaned at a base pressure of $5.4 \times 10^{-6}$ Torr in the same manner as in Example 1. Thereafter, first, molybdenum was sputtered on the iron core for 29 min under the conditions of a chamber pressure of 1 mTorr, a power of DC 4 kW and an Ar gas flow rate of 100 SCCM, and then copper was sputtered for 1 hour under the condition of a power of DC 5 kW to coat the iron core with copper, thereby obtaining a comparative iron bus bar 2 (COB-11: number 11).

Comparative Example 3

An iron core, a copper target and a molybdenum target were cleaned in the same manner as in Comparative Example 2. Thereafter, copper and molybdenum were simultaneously sputtered for 30 min under the conditions of a chamber pressure of 1 mTorr, a power of DC 4 kW and an Ar gas flow rate of 100 SCCM to form a buffer layer. In this case, after the molybdenum target and the copper target were provided such that molybdenum and copper are simultaneously sputtered while opening a shutter, a substrate provided with an iron core was reciprocated in fixed interval between the molybdenum target and the copper target to form molybdenum layers and copper layers corresponding to the number of revolutions, that is, to alternately form a plurality of thin first buffer layers made of molybdenum and a plurality of thin second buffer layers made of copper, thereby forming a buffer layer having a multilayer structure (Mo/Cu/Mo . . . Mo/Cu/Mo). Thereafter, copper was sputtered on the buffer layer for 2 hr by a power of DC 5 kW to coat the iron core with copper, thereby obtaining a comparative iron bus bar 3 (COB-12: number 12).

Experimental Example 1

The sectional images of the iron bus bars 1 and 2 of Examples 1 and 2 and the comparative bus bars 1, 2 and 3 of Comparative Examples 1 to 3, which were observed by scanning electron microscope (SEM) to measure the total thickness of their respective coating layers, are shown in FIGS. 1A to 1E, respectively.

Figure 1B:
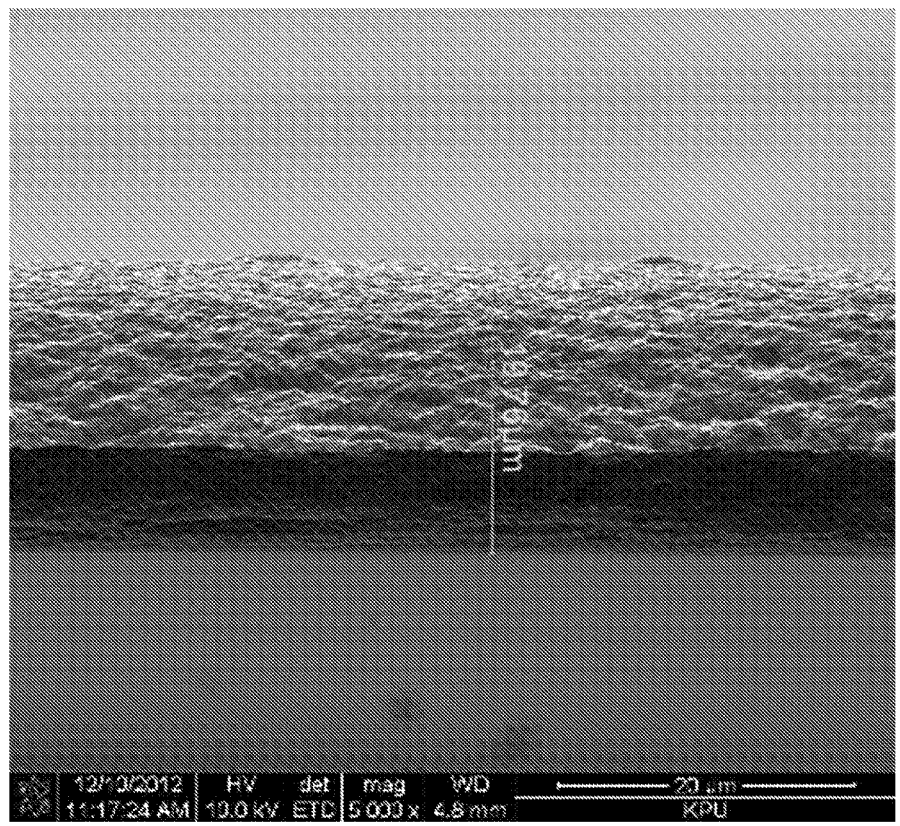
Figure 1C:
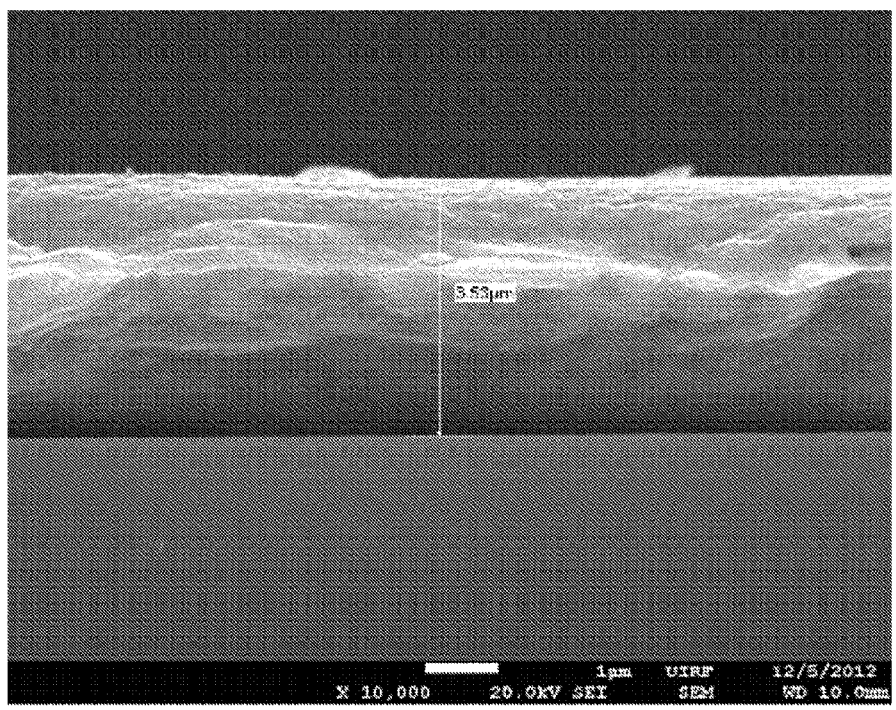
Figure 1D:
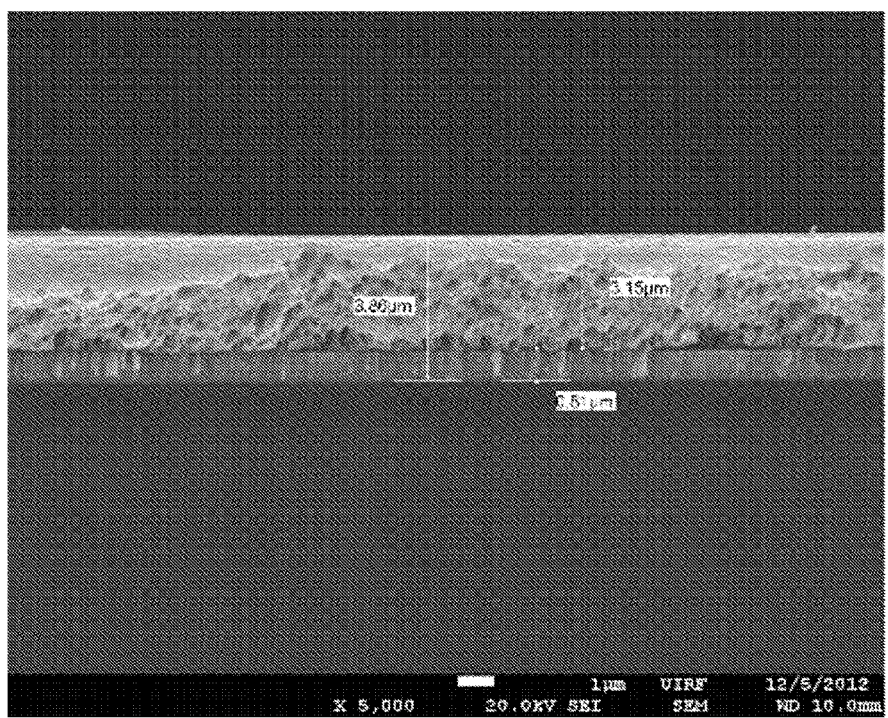
Figure 1E:
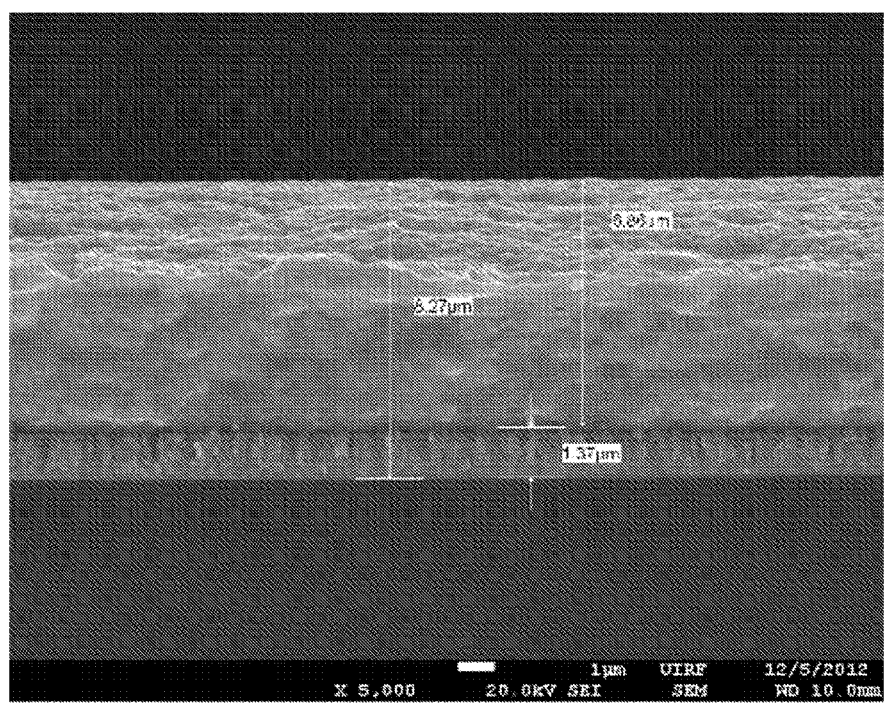

From FIG. 1A, it can be seen that the iron bus bar 1 includes a copper coating layer having a thickness of 11.6 µm. FIG. 1B shows that the iron bus bar 2 includes a copper coating layer having a thickness of 19.7 µm. Further, From FIGS. 1C to 1E, it can be seen that the comparative bus bars 1, 2 and 3 include coating layers having thicknesses of 3.53 µm, 3.86 µm and 8.27 µm, respectively.

Experimental Example 2

A commercially available aluminum specimen coated with copper, a general uncoated iron specimen, a general uncoated copper specimen and the iron bus bar 1 of Example 1 were provided, and then thermal load tests thereof were carried out. In this case, these thermal load tests were carried out using a thermal load tester. Each of the specimens having a section area of 2×15 SQ(30) was connected to the thermal load tester, and then electric current of about 100 A was applied thereto. Thereafter, the changes in temperatures of the specimens with respect to time were measured, and the results thereof are shown in FIG. 2.

Figure 2:
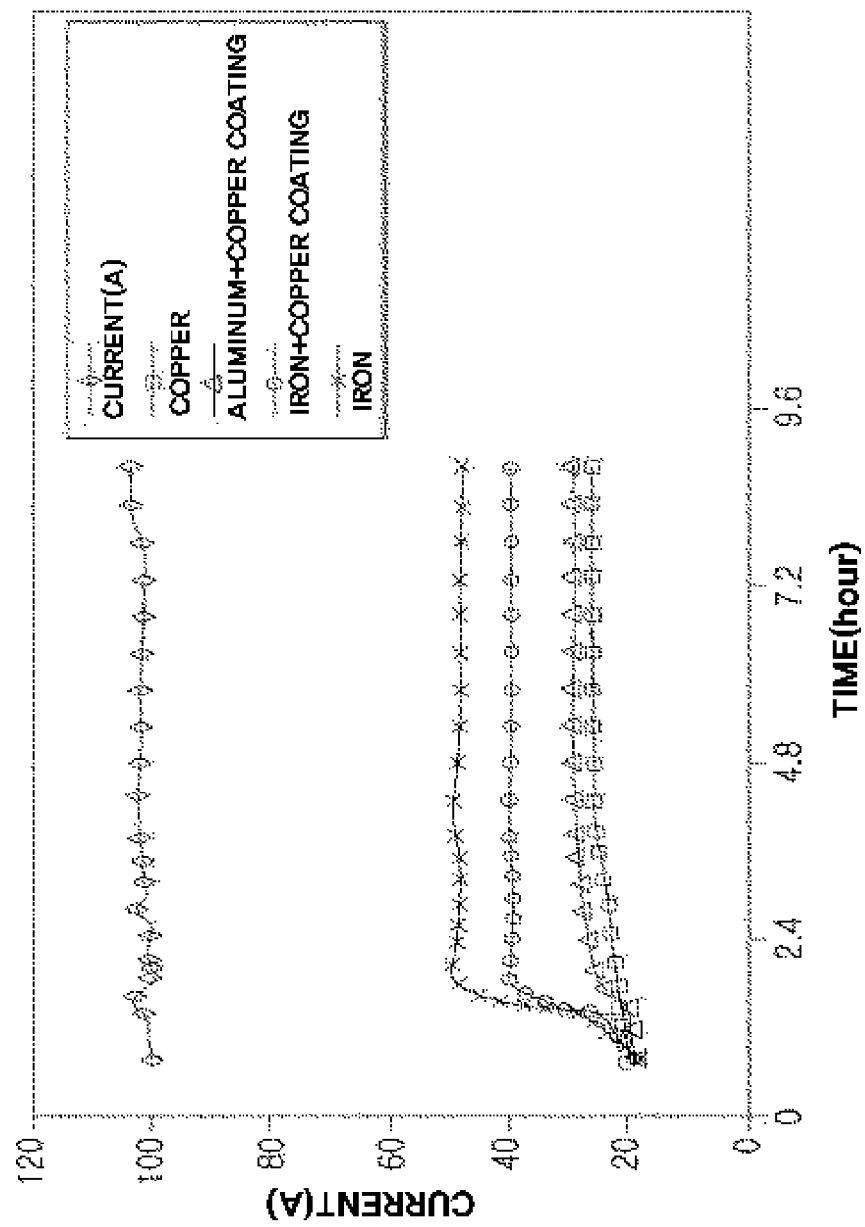
FIG. 2 is a graph showing the results of thermal load testing of a specimen according to an embodiment of the present invention.

From FIG. 2, it can be seen that the temperature of the copper specimen (copper) was 26.5° C., that of the aluminum specimen coated with copper (aluminum+copper) was 29.3° C., and that of the iron bus bar 1 of Example 1 was 39.6° C. Considering the fact that a bus bar cannot be used when a thermal load is applied until the temperature of the bus bar exceeds 40° C., the iron bus bar of the present invention can be used in various fields. Meanwhile, it can be seen that the general uncoated iron specimen (iron) cannot be used as a bus bar because its temperature is about 48.4° C.

Experimental Example 3

Figure 3:
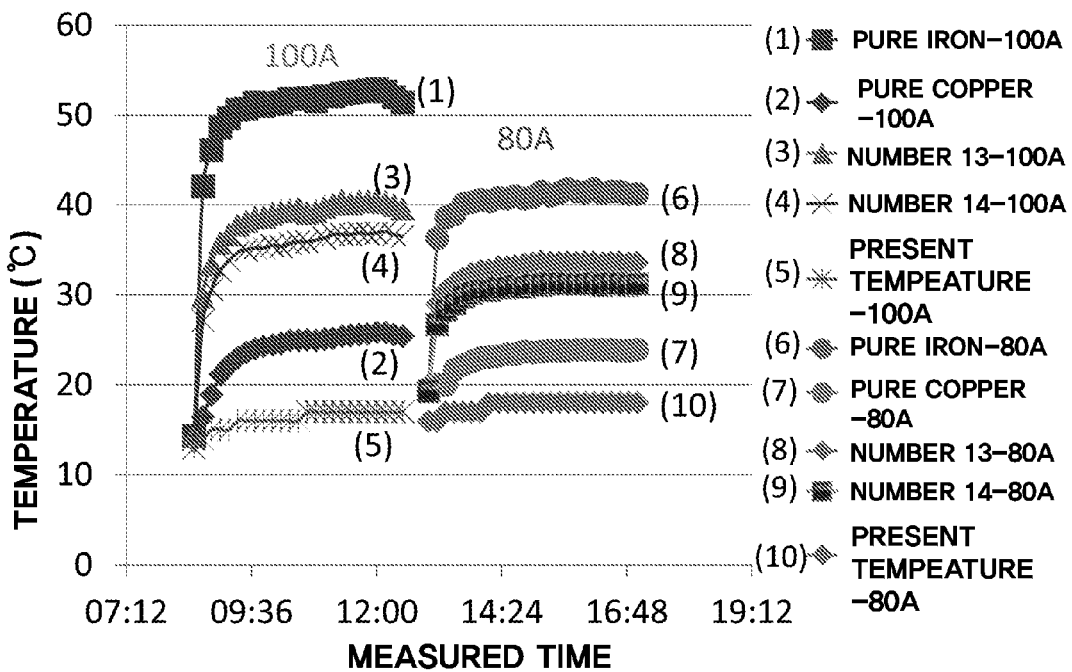
FIG. 3 is a graph showing the results of thermal load testing of specimens according to other embodiments of the present invention.

The thermal load tests of a pure iron specimen, a pure copper specimen, the iron bus bar 1 (number 13) of Example 1 and the iron bus bar 2 (number 14), each having a section area of 2×15 SQ (30), were carried out under the condition of an electric current of 100 A or 80 A in the same manner as in Experimental Example 2, and the results thereof are shown in FIG. 3.

From FIG. 3, it can be seen that the temperatures of the iron bus bars 1 and 2 were all 35° C. or lower under the condition of an electric current of 80 A, which is approximate to a real bus bar usage condition, and that their temperatures were approximately 40° C. even under the condition of an electric current of 100 A, which is a severe condition. Particularly, it can be seen that the temperature of the iron bus bar 2 was 31.1° C., which is the lowest temperature, under the condition of an electric current of 80 A, and that its temperature was 36.7° C. even under the condition of an electric current of 100 A. Therefore, it can be predicted that a coated iron core having performance similar to that of a copper bus bar can be manufactured when a copper layer is applied onto an iron core to predetermined thickness, that is, to a thickness of 10 µm or more.

Experimental Example 4

Figure 4:
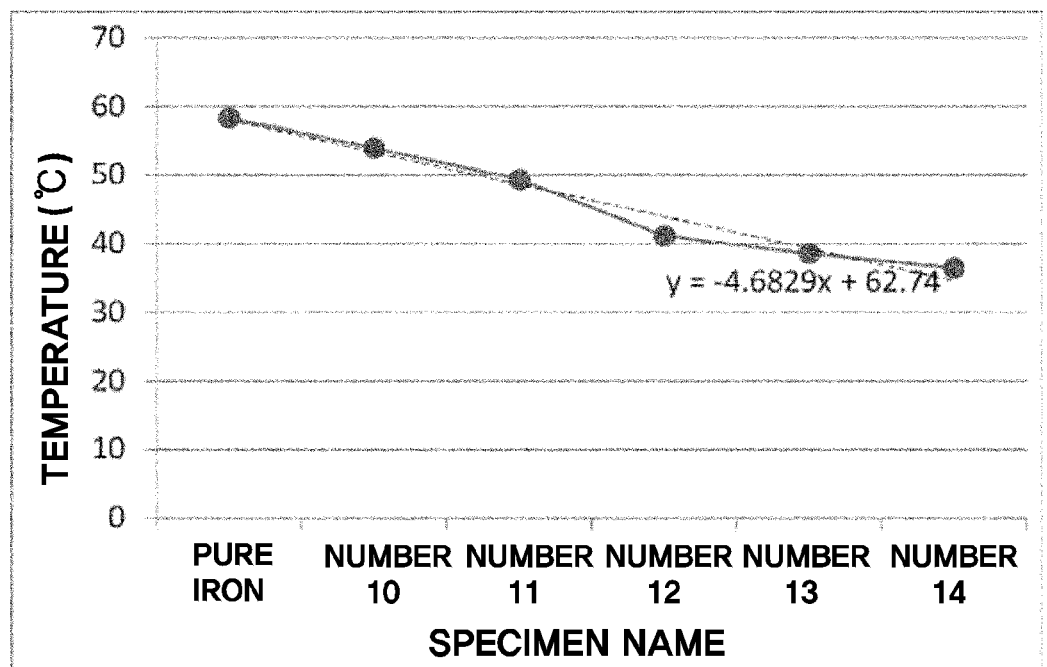
FIG. 4 is a graph showing the temperature change transition of iron bus bars obtained from Examples and Comparative Examples according to the results of thermal load tests thereof.

The thermal load tests of the iron bus bar 1 (number 13), iron bus bar 2 (number 14), comparative iron bus bar 1 (number 10), comparative iron bus bar 2 (number 11), comparative iron bus bar 3 (number 12) were carried out under the same conditions as in Experimental Example 2, and the temperature change trend curve of each of the specimens is shown in FIG. 4.

From FIG. 4, it can be seen that the comparative iron bus bar 2 and the comparative iron bus bar 3, although each has a structure of iron core/buffer layer/copper layer, have temperature unsuitable for actual use, when the thickness of the copper layer applied on the iron core is less than 10 µm.

That is, comparing the comparative iron bus bar 1 (number 10) and the comparative iron bus bar 2 (number 11), it can be seen that the thickness of the copper layer of the comparative iron bus bar 1 (number 10) is 3.53 µm, and the total thickness of the comparative iron bus bar 2 (number 11) is 3.86 µm, and thus the comparative iron bus bar 2 (number 11) consists of a buffer layer (Mo) of 0.81 µm and a copper layer of 3.15 µm. From the comparison, it can be ascertained that the thickness of the copper layer of the comparative iron bus bar 1 (number 10) is greater than that of the copper layer of the comparative iron bus bar 2 (number 11), but the total thickness of the comparative iron bus bar 2 (number 11) is greater than that of the comparative iron bus bar 1 (number 10) by 0.33 µm, so, as the results of thermal load tests, the temperature of the comparative iron bus bar 2 (number 11) is lower than that of the comparative iron bus bar 1 (number 10) by about 4° C. From the experimental results, it can be predicted that the buffer layer is effective at decreasing the thermal load.

Further, comparing the comparative iron bus bar 2 (number 11) and the comparative iron bus bar 3 (number 12), it can be seen that the total thickness of the comparative iron bus bar 3 (number 12) is 8.27 µm, and thus the comparative iron bus bar 3 (number 12) consists of a buffer layer (Mo/Cu multilayer structure) of 0.37 µm and a copper layer of 6.86 µm. From the comparison, it can be ascertained that both the comparative iron bus bar 2 (number 11) and the comparative iron bus bar 3 (number 12) are provided with buffer layers, but actually, the thickness of the copper layer of the comparative iron bus bar 3 is greater than that of the copper layer of the comparative iron bus bar 2 (number 11) by two or more times, so, as the results of thermal load tests, due to the buffer layer having a multilayer structure, the temperature of the comparative iron bus bar 3 (number 12) is lower than that of the comparative iron bus bar 2 (number 11) by about 9° C., and is not greatly different from that of the iron bus bar 1 (number 13), as ascertained in the following Experimental Examples.

Experimental Example 5

Figure 5:
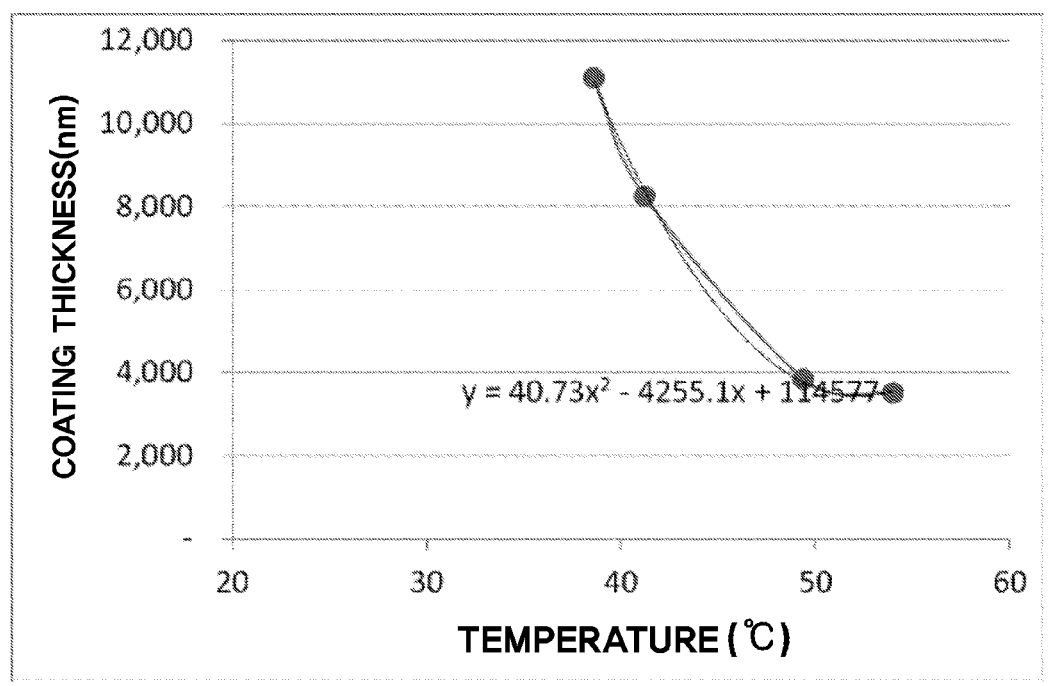
FIG. 5 is a graph showing the temperature change of a coating layer applied on an iron core with respect to the thickness change thereof during a thermal load test.

Thermal load tests for observing the temperature changes of specimens depending on the thickness of a copper layer applied on an iron core were carried out, and the results thereof are shown in FIG. 5.

As shown in FIG. 5, it can be ascertained that, as the results of the thermal load tests, the temperature of each of the specimens is lower than 40° C. only when the thickness of the copper layer applied on the iron core is 10 µm or more.

From the experimental results, it can be ascertained that the thickness of the copper layer applied on the iron core must be 10 μm or more.

Experimental Example 6

Figure 6:
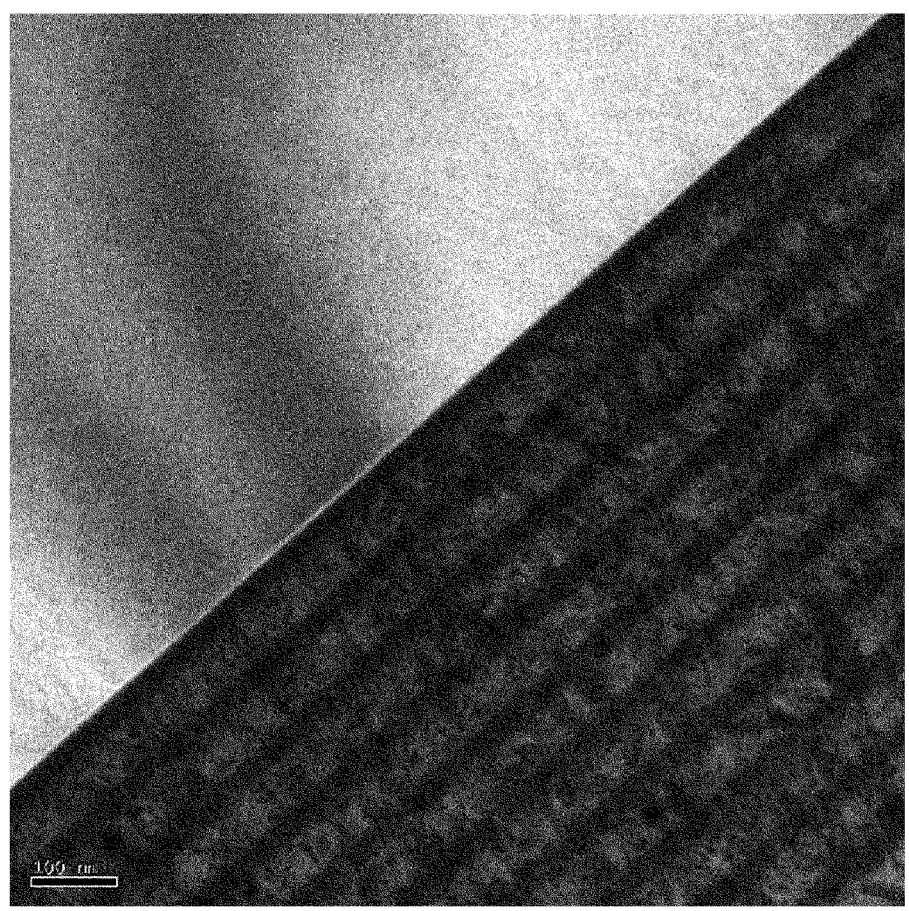
FIG. 6 is a transmission electron microscope (TEM) photograph of a sectional image of a multilayered buffer layer.

The sectional image of the comparative iron bus bar 3 (number 12) of Comparative Example 3, which was observed by transmission electron microscope (TEM), are shown in FIG. 6.

From FIG. 6, it can be seen that the buffer layer formed on the comparative iron bus bar 3 (number 12) has a multilayer structure in which a plurality of thin layers are deposited. Particularly, as described above, the buffer layer formed on the comparative iron bus bar 3 (number 12) was formed by alternately depositing thin films made of two different kinds of metals, that is, molybdenum and copper. FIG. 6 shows that thin films respectively made of molybdenum and copper are clearly distinguished.

Meanwhile, it can be seen that the total thickness of the comparative iron bus bar 3 (number 12) is 8.27 μm, and thus the comparative iron bus bar 3 (number 12) consists of a buffer layer (Mo/Cu) of 1.37 μm and a copper layer of 6.86 μm, and that the comparative iron bus bar 1 (number 13) consists of a copper layer of 11.60 μm. Comparing the thickness of the copper layer of the comparative iron bus bar 3 (number 12) and the thickness of the copper layer of the comparative iron bus bar 1 (number 13), the thickness of the copper layer of the comparative iron bus bar 1 (number 13) is greater than that of the copper layer of the comparative iron bus bar 3 (number 12) by about 80%, and the total thickness of the comparative iron bus bar 1 (number 13) is greater than that of the comparative iron bus bar 3 (number 12) by about 40%.

However, it can be seen that the difference in thermal load test temperature therebetween is 2° C. or less, which is very small. From the experimental results, it can be predicted that the buffer layer having a multilayer structure of the comparative iron bus bar 3 (number 12) is effective at decreasing the thermal load.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

The invention claimed is:

1. An iron bus bar, comprising:
    an iron core comprised of an iron-containing material;
    a copper layer formed on the surface of the iron core to a thickness of 10 to 30 μm;
    a corrosion-resistant layer formed on the surface of the copper layer to a thickness of 1 μm or less; and
    a buffer layer formed between the iron core and the copper layer, the buffer layer comprising:
        a first buffer layer formed on the iron core to have a thickness of 1 μm or less from the surface of the iron core and including iron in an amount of 92.4 to 100 wt % at an interface thereof making contact with the iron core; and
        a second buffer layer formed between the first buffer layer and the copper layer to have a thickness of 1 μm or less and including copper in an amount of 95.9 to 100 wt % at an interface thereof making contact with the copper layer;
    wherein the corrosion-resistant layer includes Cu and at least one selected from the group consisting of Sn, Cr, Zr and Ag;
    the content of Cu in the corrosion-resistant layer reduced as the distance from the surface of the corrosion-resistant layer decreases; and
    the buffer layer is configured such that the first buffer layer and the second buffer layer are alternately and repeatedly formed two or more times.

2. The iron bus bar of claim 1, wherein the iron-containing material is any one selected from the group consisting of pure iron, carbon steel, stainless steel, a Fe—Al alloy and a Fe—Cu alloy.

3. The iron bus bar of claim 1, wherein the corrosion-resistant layer includes 0 to 15.9 wt % of any one selected from the group consisting of Sn, Cr, Zr and Ag and 84.2 to 100 wt % of Cu at an interface thereof making contact with the copper layer.

4. The iron bus bar of claim 1, further comprising an uppermost layer having a thickness of 1 μm or less and including at least one of Ag and Ti, which is formed on the surface of the corrosion-resistant layer.

* * * * *